United States Patent
Lu et al.

(10) Patent No.: US 11,121,027 B2
(45) Date of Patent: Sep. 14, 2021

(54) HIGH ASPECT RATIO VIA ETCH USING ATOMIC LAYER DEPOSITION PROTECTION LAYER

(71) Applicant: Tokyo Electron Limited, Tokyo (JP)

(72) Inventors: Yen-Tien Lu, Albany, NY (US); Xinghua Sun, Clifton Park, NY (US); Eric Chih-Fang Liu, Guilderland, NY (US); Andrew W. Metz, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 187 days.

(21) Appl. No.: 16/213,628

(22) Filed: Dec. 7, 2018

(65) Prior Publication Data

US 2019/0181041 A1     Jun. 13, 2019

Related U.S. Application Data

(60) Provisional application No. 62/596,679, filed on Dec. 8, 2017.

(51) Int. Cl.
| | |
|---|---|
| *H01L 21/768* | (2006.01) |
| *H01L 21/311* | (2006.01) |
| *H01L 21/02* | (2006.01) |

(52) U.S. Cl.
CPC .... *H01L 21/76816* (2013.01); *H01L 21/0228* (2013.01); *H01L 21/02164* (2013.01); *H01L 21/31116* (2013.01); *H01L 21/31144* (2013.01); *H01L 21/76819* (2013.01); *H01L 21/76831* (2013.01); *H01L 2221/1063* (2013.01)

(58) Field of Classification Search
None
See application file for complete search history.

(56) References Cited

U.S. PATENT DOCUMENTS

| | | | | | |
|---|---|---|---|---|---|
| 5,767,018 | A | * | 6/1998 | Bell | H01L 21/32135 |
| | | | | | 257/E21.31 |
| 6,358,842 | B1 | * | 3/2002 | Zhou | H01L 21/31138 |
| | | | | | 257/E21.256 |

(Continued)

FOREIGN PATENT DOCUMENTS

KR     1020170099856       9/2017

OTHER PUBLICATIONS

Nternational Searching Authority, International Search Report and Written Opinion issued in rresponding PCT Application No. PCT/US2018/064528, dated Mar. 22, 2019, 12 pages.

*Primary Examiner* — Erik T. K. Peterson
(74) *Attorney, Agent, or Firm* — Wood Herron & Evans LLP (57) ABSTRACT

A method for the via etching steps of a substrate manufacturing process flow is provided. The substrate processing techniques described provide for etching vias by providing a protection layer on the via sidewall during at least portions of the via etching process. In one embodiment, an atomic layer deposition (ALD) layer is formed on the via sidewalls to protect the dielectric layers through which the via is formed. The ALD layer may lessen bowing effects in low k dielectric layers which may result from etching barrier low k (blok) layers or from other process steps. After via formation, the ALD layer may be removed. The techniques are particularly suited for forming skip vias and other high aspect ratio vias formed in low k and ultra-low k dielectric layers.

19 Claims, 9 Drawing Sheets

(56) References Cited

U.S. PATENT DOCUMENTS

| | | | |
|---|---|---|---|
| 9,202,744 B1* | 12/2015 | Ban | H01L 23/5226 |
| 9,384,998 B2* | 7/2016 | Hudson | H01J 37/32651 |
| 9,385,318 B1* | 7/2016 | Henri | H01L 45/141 |
| 9,805,972 B1 | 10/2017 | Zhang et al. | |
| 10,109,526 B1* | 10/2018 | Zhang | H01L 21/76831 |
| 2003/0020176 A1* | 1/2003 | Nambu | H01L 21/76829 |
| | | | 257/774 |
| 2005/0153538 A1* | 7/2005 | Tsai | H01L 21/31116 |
| | | | 438/636 |
| 2006/0019485 A1* | 1/2006 | Komai | H01L 21/76813 |
| | | | 438/627 |
| 2007/0042598 A1 | 2/2007 | Park | |
| 2009/0286402 A1* | 11/2009 | Xia | H01L 21/3141 |
| | | | 438/703 |
| 2013/0207068 A1* | 8/2013 | Pellizzer | H01L 27/2427 |
| | | | 257/5 |
| 2013/0236989 A1 | 9/2013 | Ranjan et al. | |
| 2013/0344699 A1* | 12/2013 | Chiba | H01L 21/76802 |
| | | | 438/700 |
| 2015/0167163 A1* | 6/2015 | Kubota | H01L 21/02164 |
| | | | 216/39 |
| 2015/0380246 A1* | 12/2015 | Hu | H01L 21/0338 |
| | | | 438/736 |
| 2016/0099174 A1* | 4/2016 | Wu | H01L 21/76808 |
| | | | 438/618 |
| 2016/0163558 A1 | 6/2016 | Hudson et al. | |
| 2016/0365271 A1* | 12/2016 | Chang | H01L 29/41791 |
| 2017/0076945 A1* | 3/2017 | Hudson | H01J 37/32908 |
| 2017/0110398 A1* | 4/2017 | Chang | H01L 21/76832 |
| 2017/0140982 A1* | 5/2017 | Tien | H01L 21/31111 |
| 2017/0178920 A1* | 6/2017 | Dole | H01L 21/31116 |
| 2017/0179020 A1* | 6/2017 | Chang | H01L 21/76877 |
| 2017/0194247 A1* | 7/2017 | Chang | H01L 21/76805 |
| 2017/0229341 A1* | 8/2017 | Chang | H01L 23/528 |
| 2017/0345904 A1* | 11/2017 | Clark | H01L 29/161 |
| 2018/0061659 A1* | 3/2018 | Tan | C23C 16/50 |
| 2018/0061700 A1* | 3/2018 | Sun | H01L 21/02063 |
| 2018/0151445 A1* | 5/2018 | Hsu | H01L 21/0217 |
| 2019/0067089 A1* | 2/2019 | Yang | H01L 21/76811 |
| 2019/0096748 A1* | 3/2019 | Kuo | H01L 21/768 |
| 2019/0355617 A1* | 11/2019 | O'Meara | H01L 21/31144 |
| 2020/0051859 A1* | 2/2020 | Sun | H01L 21/76811 |

\* cited by examiner

HIGH ASPECT RATIO VIA ETCH USING ATOMIC LAYER DEPOSITION PROTECTION LAYER

CROSS REFERENCE TO RELATED APPLICATIONS

This application is related to and claims priority to U.S. Provisional Patent Application Ser. No. 62/596,679 filed on Dec. 8, 2017, the entire contents of which are herein incorporated by reference.

BACKGROUND

The present disclosure relates to the processing of substrates, such as for example, semiconductor substrates. In particular, it provides a novel method to improve the etching of vias.

As geometries in substrate processing continue to shrink, the technical challenges to forming structures on substrates increase. One such challenge is via etching. More specifically, as geometries shrink, aspect ratios of vias have increased, increasing the challenges of etching the vias. Further, the use of skip vias has greatly increased the challenge of etching vias. Skip vias connect through multiple dielectric layers, skipping connection to a conductor layer located between the dielectric layers. Thus, for example, a skip via may connect a first metal layer to a third metal layer, skipping the intervening second metal layer. The skip via may be, thus, viewed as a stack of vias, the resulting aspect ratio of the via accordingly being greatly increased. Such a use of a skip via may be formed in the Back End of Line (BEOL) processing steps of a semiconductor manufacturing process for connecting various conductor layers. It will be recognized, however, that high aspect ratio vias and skip vias may be used in other points in a substrate processing process flow.

Figure 1:
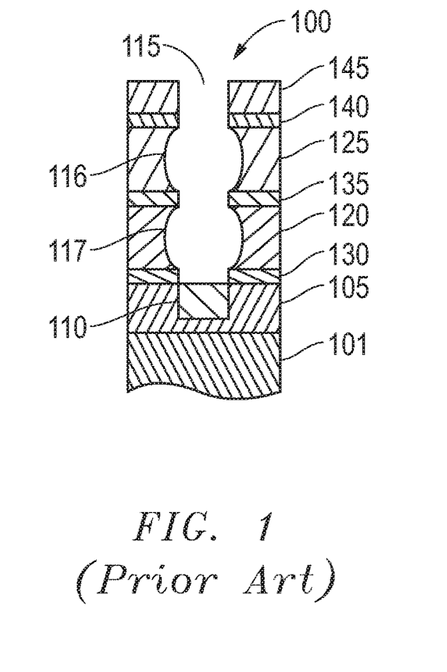
FIG. 1 illustrates an exemplary prior art structure that demonstrates the effects of via profile bowing in a skip via.

As critical dimensions of vias shrink and aspect ratios increase, it has become increasing difficult to maintain the via profile. One such problem is the formation of a "bowing" profile in the dielectric layers when etching a skip via. FIG. 1 illustrates an example bowing profile that may occur during the formation of a skip via. As shown in FIG. 1, a substrate structure 100 is provided. An underlying dielectric 105 and a first conductor 110 are provided on a substrate 101. It will be recognized by those skilled in the art that the underlying dielectric 105 may be formed over numerous other substrate layers (not shown). Thus, for example, the structure 100 may be a via structure formed during the BEOL processing steps of a semiconductor manufacturing process. An electrical connection will be made through the use of a skip via 115. Skip via 115 may be formed through two levels of dielectric layers separated by a stop or barrier layer 135, a lower low K dielectric layer 120 and upper low k dielectric layer 125. The lower low k dielectric layer 120 and upper low k dielectric layer 125 may be a lower ultra-low k dielectric layer and an upper ultra-low k dielectric layer respectively. Thus, a first ultra-low k dielectric layer and a second ultra-low k dielectric layer are provided. Barrier/etch stop layers known as "blok" (barrier low k) layers are also shown to provide a lower low k barrier layer and an upper low k barrier layer under the dielectric layers. In the example shown, an nblok layer (a nitrogen doped low k barrier layer, such as for example, a nitrogen doped silicon carbide) may be utilized. Thus, a lower nblok layer 130 and upper nblok layer 135 are provided as shown. A hard mask layer 140 and an organic planarization layer (OPL) 145 may also be utilized as part of the via patterning process.

As shown in FIG. 1, rather than having a straight sidewall, the skip via 115 may exhibit profile "bowing" in the lower low k dielectric layer 120 and the upper low k dielectric layer 125. Thus, as shown in FIG. 1, sidewalls 116 and 117 show undercut or bowing. Such bowing may typically result from the etching of the lower nblok layer 130 and upper nblok layer 135. The bowing often may result due to the relatively low selectivity during the nblok etch process between the nblok materials and the ULK dielectric materials. Subsequent removal of the OPL 145 may also increase the bowing of the profile. The bowed profile may cause obstacles to the proper formation of a conductor in the skip via 115 and impact the via yield.

It would be desirable to provide a substrate processing technique which improves the formation of vias, such as for example a skip via, and lessens bowing in the via.

SUMMARY

Described herein is an innovative method for the via etching process flow steps of a substrate manufacturing process flow. The substrate processing techniques described provide for etching vias by providing a protection layer on the via sidewall during at least portions of the via etching process. In one embodiment, an atomic layer deposition (ALD) layer is formed on the via sidewalls to protect the dielectric layers through which the via is formed. The ALD layer may lessen bowing effects in low k dielectric layers which may result from etching blok layers or from other process steps. After via formation, the ALD layer may be removed. The techniques are particularly suited for forming skip vias and other high aspect ratio vias formed in low k and ultra-low k dielectric layers. In one embodiment, a method for processing a substrate is provided.

In one embodiment, a method is provided for processing a substrate to form a via. The method may comprise providing the substrate with a patterned layer having a via pattern, providing at least a first low k dielectric layer underlying the patterned layer, and providing at least a first barrier layer underlying the first low k dielectric layer. The method may further comprise etching the first low k dielectric layer to form the via pattern in the first low k dielectric layer. After etching the first low k dielectric layer, the method may comprise performing an atomic layer deposition (ALD) process to deposit a protective layer on via sidewalls of the first low k dielectric layer, the atomic layer deposition process being separate from the etching the first low k dielectric layer step. After performing the ALD process, the method may comprise etching the first barrier layer, wherein the protective layer protects the via sidewalls of the first low k dielectric layer during the etching of the first barrier layer to limit bowing of the first low k dielectric layer.

In another embodiment, a method for processing a substrate to form a skip via is provided. The method may comprise providing the substrate with a patterned layer having a via pattern, providing at least an upper low k dielectric layer underlying the patterned layer, providing at least an upper barrier layer underlying the upper low k dielectric layer, providing at least a lower low k dielectric layer underlying the upper barrier layer, and providing at least a lower barrier layer underlying the lower low k dielectric layer. The method may further comprise etching the upper low k dielectric layer to form the via pattern in the upper low k dielectric layer. After etching the upper low k dielectric layer, the method may comprise performing a first atomic layer deposition (ALD) process to deposit a first protective layer on via sidewalls of the upper low k dielectric layer. After performing the first ALD process, the method may comprise etching the upper barrier layer, wherein the first protective layer protects the via sidewalls of the upper low k dielectric layer during the etching of the upper barrier layer to limit bowing of the upper low k dielectric layer. The method may further comprise etching the lower low k dielectric layer to form the via pattern in the lower low k dielectric layer. After etching the lower low k dielectric layer, the method may comprise performing a second atomic layer deposition (ALD) process to deposit a second protective layer on via sidewalls of the lower low k dielectric layer. After performing the second ALD process, the method may comprise etching the lower barrier layer, wherein the second protective layer protects the via sidewalls of the lower low k dielectric layer during the etching of the upper barrier layer to limit bowing of the lower low k dielectric layer.

In yet another embodiment, a method for patterning a substrate is provided. The method may comprise providing the substrate with a via patterned structure, the patterned structure having an organic planarization layer (OPL), a hard mask layer, a first ultra-low K (ULK) layer, a first nitrogen doped low k barrier (nblok) layer, a second ULK layer, a second nblok layer, and an underlying layer. The method may further comprise performing a first ULK layer open process, performing a first atomic layer deposition (ALD) oxide deposition to form a first ALD oxide layer and performing a first nblok open process, the first ALD oxide layer protecting at least portions of the first ULK layer during the first nblok open process. The method may further comprise performing a second ULK layer open process, performing a second atomic layer deposition (ALD) oxide deposition to form a second ALD oxide layer, and performing a second nblok open process, the second ALD oxide layer protecting at least portions of the second ULK layer during the second nblok open process. Finally, the method may comprise performing an ALD oxide removal process.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 2:
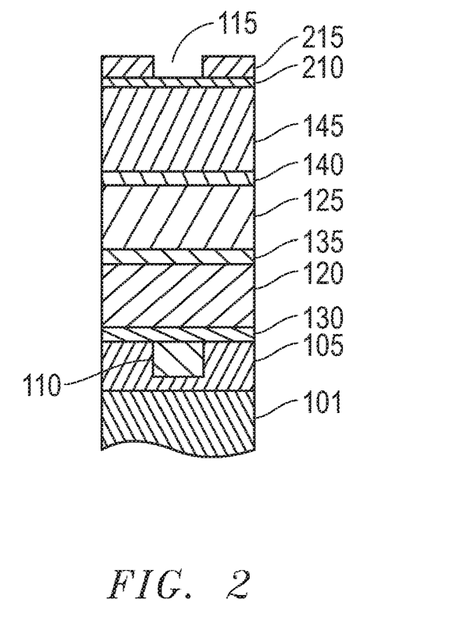
FIGS. 2-11 illustrate one exemplary process flow utilizing the via etching techniques described herein.

An exemplary skip via structure which may be processed according to the via etching techniques disclosed herein is shown in FIG. 2. The structure of FIG. 2 is merely exemplary and it will be recognized that the techniques described herein may be utilized in a wide manner of via process flows and structures. As shown in FIG. 2, the starting structure of FIG. 2 has material layers similar to that as shown in FIG. 1. An underlying dielectric layer 105 and a first conductor 110 are provided. The underlying dielectric layer 105 may be formed over a substrate 101. The substrate may be any substrate for which the use of patterned features is desirable. For example, in one embodiment, the substrate may be a semiconductor substrate having one or more semiconductor processing layers formed thereon. In one embodiment, the substrate may be a substrate that has been subject to multiple semiconductor processing steps which yield a wide variety of structures and layers, all of which are known in the substrate processing art and may be considered to be part of the substrate. In one embodiment, the concepts disclosed herein may be utilized at a BEOL processing step. In other embodiments, the concepts disclosed herein may be utilized at a front end of line (FEOL) process step. The techniques described herein may be utilized to provide a technique to etch via structures while minimizing bowing of various layers during the via etch process.

A lower low K dielectric layer 120 and upper low k dielectric layer 125 are also provided as shown in FIG. 2. The lower low k dielectric layer 120 and upper low k dielectric layer 125 may be formed by any of a wide variety of techniques known in the art. For example, in the example provided, the dielectric layers may be any of a wide variety of dielectric layers, including for example low k dielectrics. Further, the dielectric layers may be formed in any of a variety of manners, including spin on and plasma deposition techniques. In one embodiment, lower low K dielectric layer 120 and upper low k dielectric layer 125 are low k dielectric having a dielectric constant less than about 3. In another embodiment the lower low K dielectric layer 120 and upper low k dielectric layer 125 are ultra-low k (ULK) dielectrics having a dielectric constant of less than 2.4. In one example, the ULK dielectrics are used as the dielectric of a BEOL process step and the vias formed in the ULK dielectrics are vias used to connect conductor lines of the BEOL process. In one example, the lower low K dielectric layer 120 and upper low k dielectric layer 125 may each have a thickness of about 45 nm to 85 nm and more preferable around 50 nm to 75 nm.

Barrier/etch stop blok layers are also shown. In the example shown in FIG. 2, a lower nblok layer 130 and upper nblok layer 135 are provided. In the example, the lower nblok layer 130 and the upper nblok layer 135 may be a nitrogen doped blok layer, such as for example, a nitrogen doped silicon carbide barrier/etch stop layer. It will be recognized that any of a wide variety of other blok layers may be utilized, while still obtaining the benefits of the techniques disclosed herein. Other exemplary blok materials include, but are not limited to, silicon oxide, silicon nitride, silicon carbon nitride, aluminum oxide, and aluminum nitride. In one example, the lower nblok layer 130 and the upper nblok layer 135 may each have a thickness of about 5 nm to 20 nm and more preferable 8 nm to 17 nm. A hard mask layer 140 and an organic planarization layer (OPL) 145 may also be utilized as part of the via patterning process. The OPL 145 may each have a thickness of about 90 nm to 210 nm and more preferable 100 nm to 180 nm. A silicon antireflective layer 210 and a patterned photoresist layer 215 may be formed over the OPL 145. The pattern of the patterned photoresist layer 215 may provide a via pattern for a via to be made to the first conductor 110, as shown as a pattern of skip via 115. Thus, as shown, a semiconductor structure is provided through which a skip via is desired to be formed through the various dielectric layers and blok layers. In one embodiment, the depth of the skip via ultimately formed as described below may be more than 100 nm and even more than 150 nm. In one embodiment, the critical dimension (CD) width of the pattern of the skip via may be less than 30 nm and even less than 20 nm. Thus, the aspect ratio of the formed skip via will be almost double other vias. The skip via to be formed will be a high aspect ratio skip via, a via having an aspect ratio greater than 6:1 and that may include even greater than 8:1 aspect ratios. It will be recognized that the various photolithography layers, dielectric layers, blok layers, etc. shown in FIG. 2 are merely exemplary. Thus, it will be recognized that the techniques disclosed herein may be utilized with other structures having more, less and/or different layers than those shown in FIG. 2.

Figure 3:
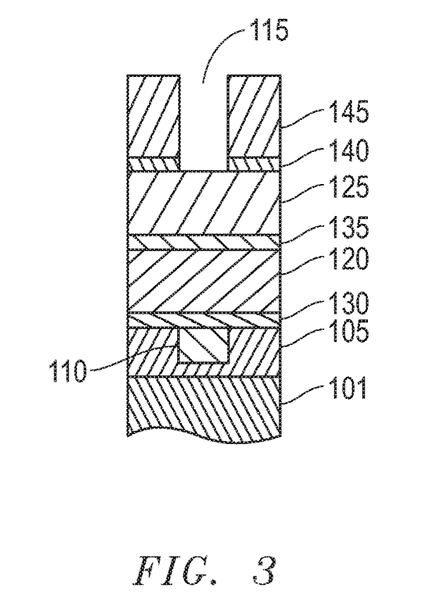
Figure 4:
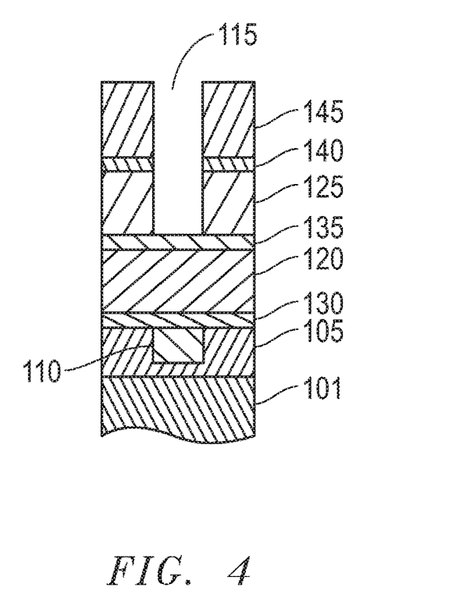
Figure 5:
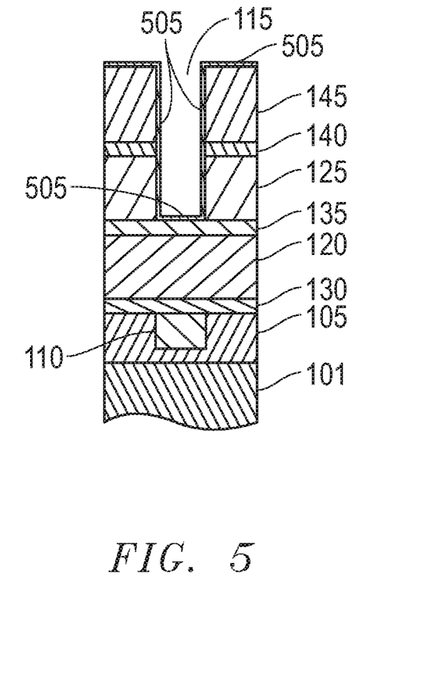

Processing of the substrate of FIG. 2 may proceed as shown in FIG. 3. As shown in FIG. 3, the skip via 115 pattern has been etched in the OPL 145 and hard mask layer 140. As shown, the patterned photoresist layer 215 and the silicon antireflective layer 210 have been removed. Next, as shown in FIG. 4, the upper low k dielectric layer 125 has been etched, stopping on the upper nblok layer 135. Processing of the substrate may then proceed to the step shown in FIG. 5. As shown in FIG. 5, a thin atomic layer deposition (ALD) layer such as ALD layer 505 is formed, coating the sidewalls of the then exposed portions of the skip via 115 and the bottom of the skip via 115. In one embodiment, the ALD layer 505 may be a thin coating of approximately 1 to 4 nm, and more preferably 2 to 3 nm. In one embodiment, the ALD layer 505 comprises silicon oxide, such as for example silicon dioxide. In other embodiments, the ALD layer may be comprised of, for example, silicon nitride, aluminum oxide, or silicon carbide. It will be recognized, however, that other materials and thicknesses may be utilized while still obtaining the benefits of the techniques disclosed herein. Further, the ALD deposition step may be incorporated either ex-situ or in-situ with the prior and subsequent etch steps. In one exemplary embodiment, the ALD deposition step may be incorporated in the Vigus™ dielectric plasma etch system available from Tokyo Electron Ltd. In an exemplary process the ALD silicon dioxide layer may be formed in plasma deposition process using silanes and oxygen-rich chemicals.

Figure 6:
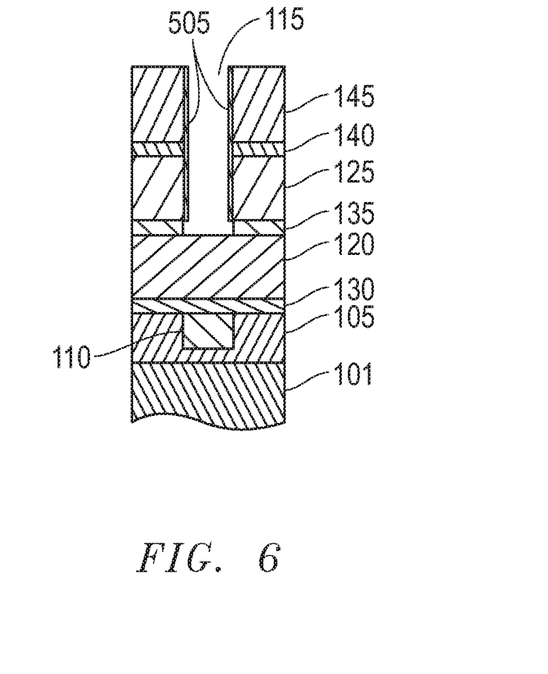
Figure 7:
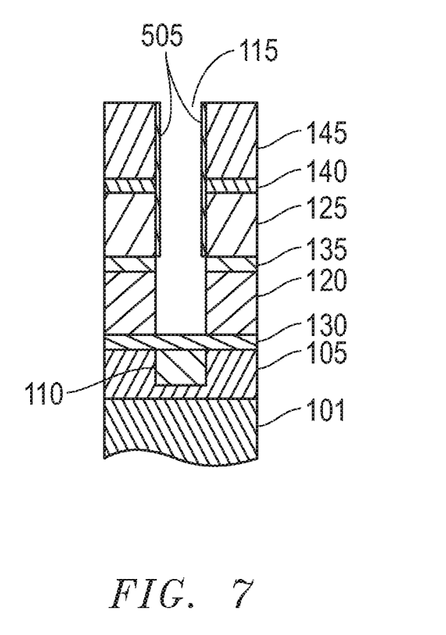
Figure 8:
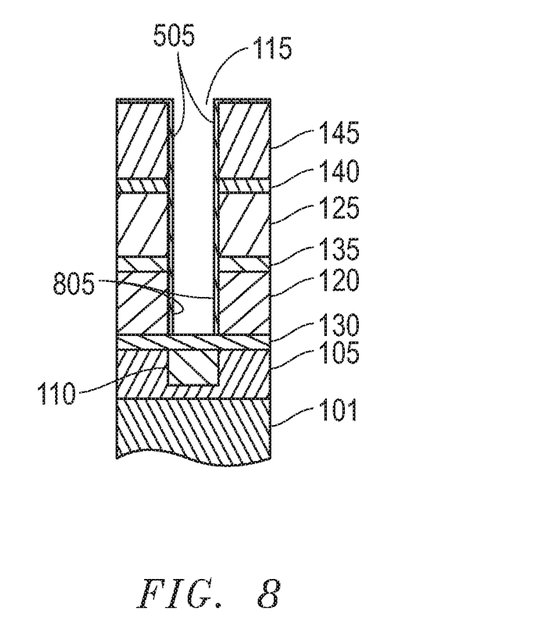

Next, the upper nblok layer 135 (and the ALD material on top of the upper nblok layer 135 and the upper surface of OPL 145) may be anistropically etched, leaving the structure as shown in FIG. 6. It is noted that during the nblok etch the ALD material on top of the upper nblok layer 135 and the upper surface of OPL 145 are etched off. However, most of the ALD layer on the sidewalls of the via are left because of the directionality of the nblok plasma etching process. Note, as shown in FIG. 6, the ALD layer 505 thus provides protection to prevent bowing of the upper low k dielectric layer 125 during the etch of the upper nblok layer 135. Processing may then proceed as shown in FIG. 7. As shown in FIG. 7, the lower low k dielectric layer 120 may then be etched, with the etch stopping on the lower nblok layer 130. During this step, the ALD layer 505 continues to act as a sidewall protection, protecting the sidewalls of the upper low k dielectric layer 125. Then as shown in FIG. 8, another ALD step is performed so that the ALD layer 505 is now extended to cover the exposed sidewalls of the lower low k dielectric layer as indicated by additional ALD layer portions 805. In one embodiment, the thickness of the additional ALD layer portions 805 may be a thin coating of approximately 1 to 4 nm, and more preferably 2 to 3 nm. Thus, a processing flow for forming a skip via is provided in which a first atomic layer deposition oxide deposition step and a second atomic layer deposition oxide deposition step are utilized.

Figure 9:
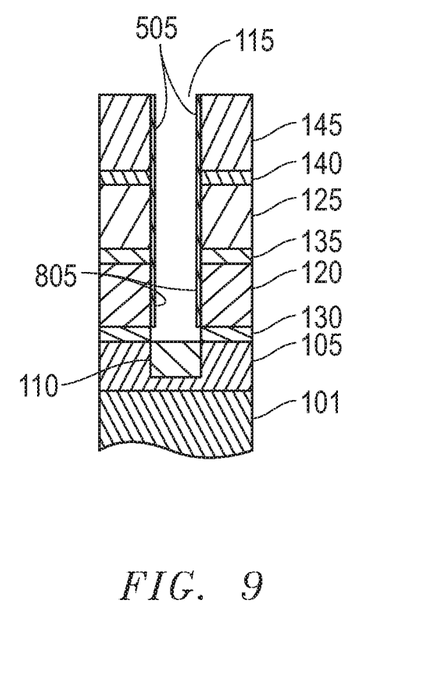

The lower nblok layer 130 may then be etched to expose the first conductor 110 as shown in FIG. 9. As with the etch of the upper nblok layer 135, the presence of the ALD layer 505 and additional ALD layer portions 805, provides protection to the exposed portions of the low k dielectric layers such that bowing of the dielectric layers in the via does not occur.

Figure 10:
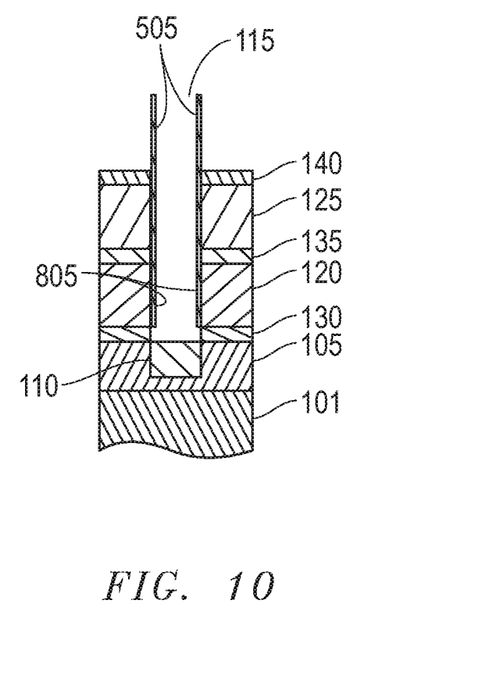
Figure 11:
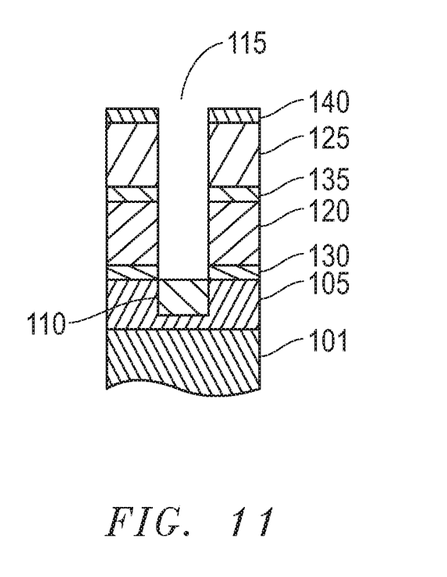

Processing may then proceed by removing the OPL 145 by utilizing a plasma ash process to leave the structure shown in FIG. 10. The ALD layer 505 and the additional ALD layer portions 805 may then be removed by plasma or non-plasma etch techniques to leave a final skip via 115 structure as shown in FIG. 11, after which substrate processing may continue with a conductor formation to fill the skip via 115 as would be known in the art. Alternatively, the ALD layer 505 and additional ALD layer portions 805 may be left in the via. However, leaving the ALD layers may affect device performance as the ALD layers may have a substantially higher dielectric constant than the various low k materials that are utilized for the dielectric and barrier layers.

It will be recognized by those skilled in the art that the techniques described with regard to FIGS. 2-11 allow for the improved formation of skip vias through the addition of three process steps to a standard skip via formation process flow: two ALD deposition steps and one ALD removal step. Further, the use of two ALD deposition steps that are separate from the etch dielectric etch steps provide for high quality control of the ALD deposition process providing control of the thickness of the ALD layers.

Figure 12:
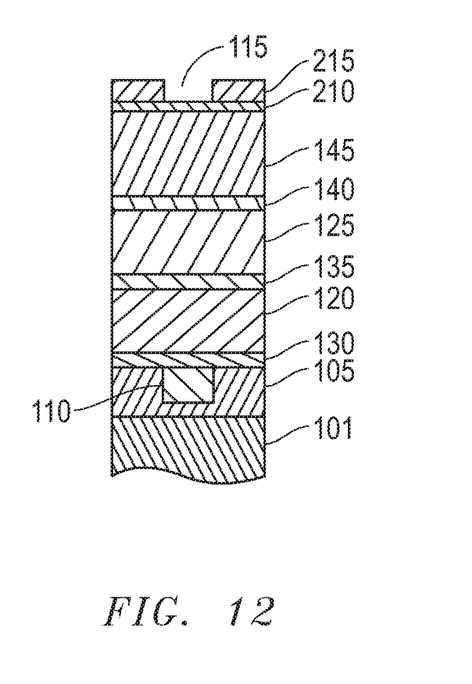
FIGS. 12-21 illustrate a second exemplary process flow utilizing the via etching techniques described herein.
Figure 13:
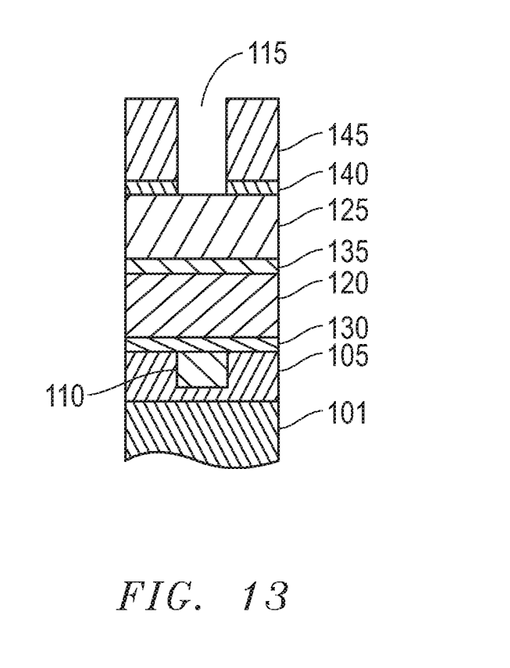
Figure 14:
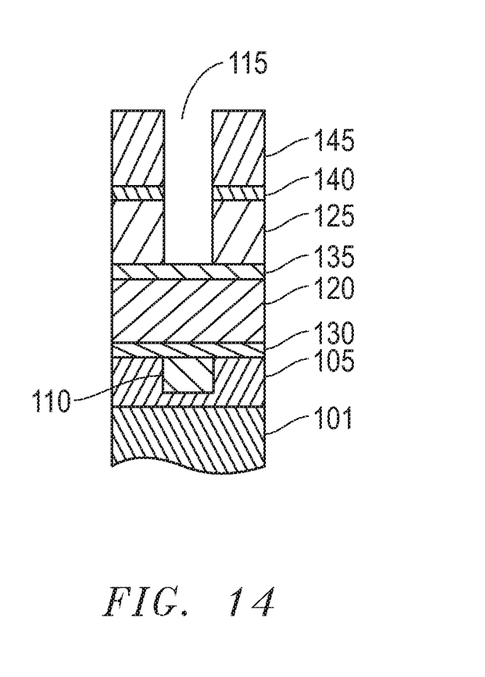
Figure 15:
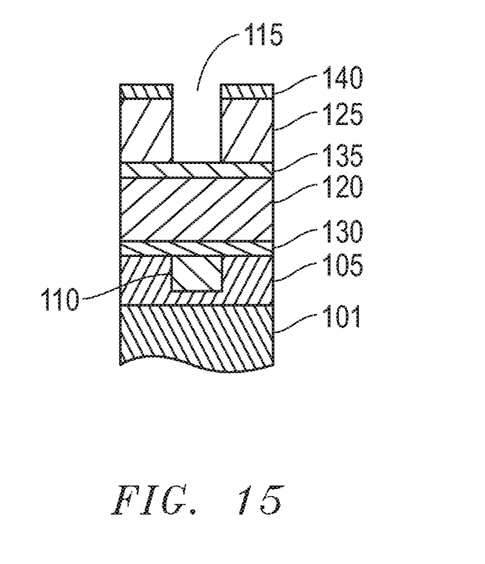
Figure 16:
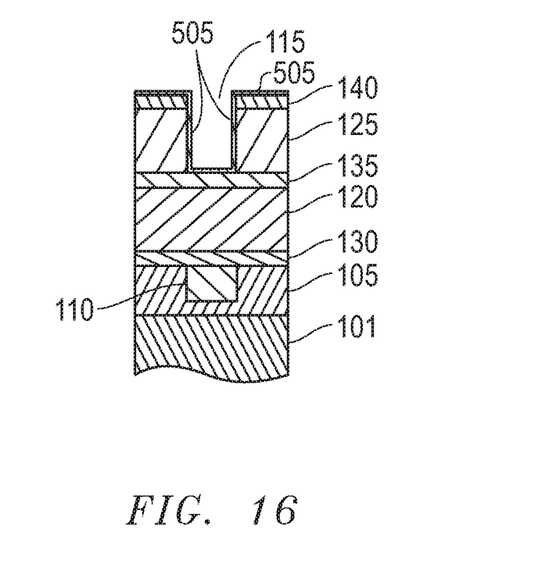
Figure 17:
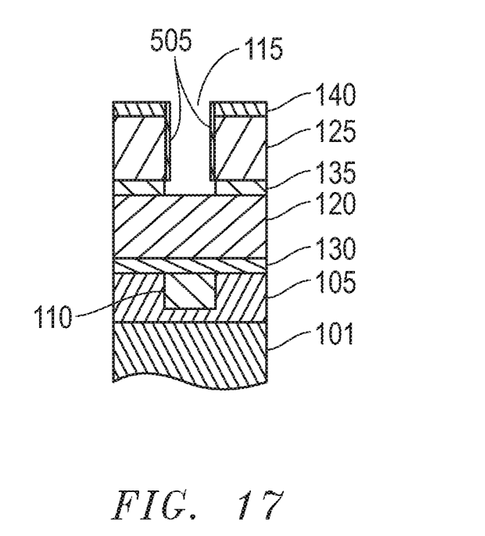
Figure 18:
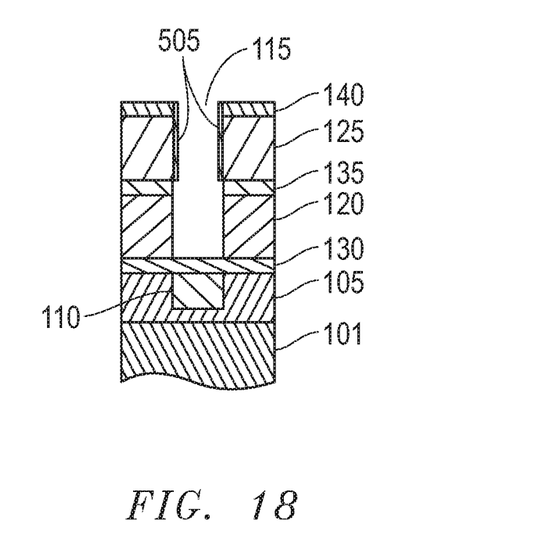
Figure 19:
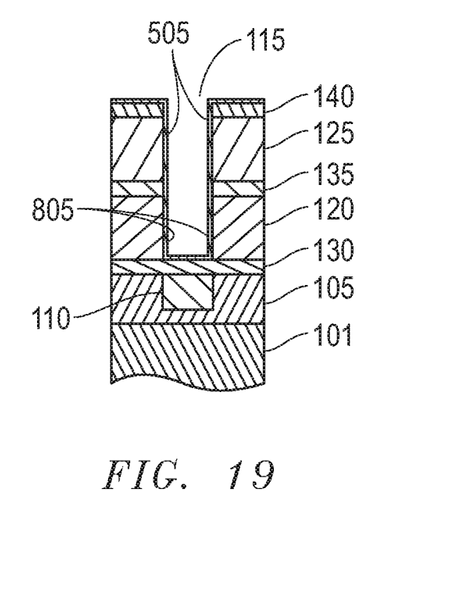
Figure 20:
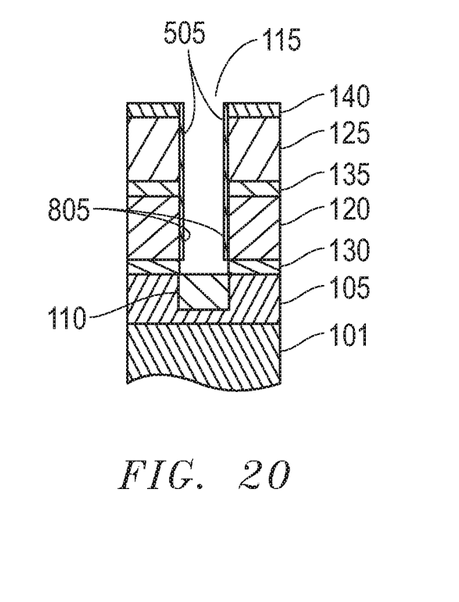
Figure 21:
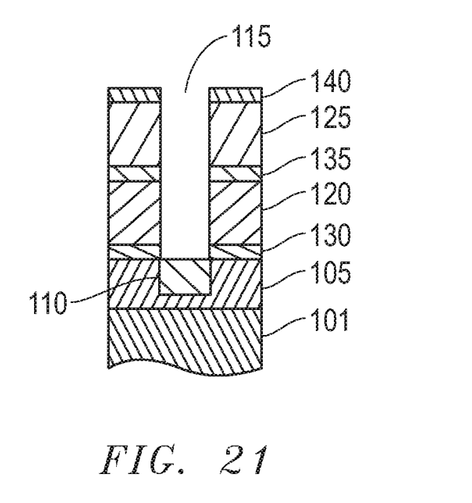

The process technique of FIGS. 2-11 illustrates a process in which the ALD steps used to line the skip via are performed before the removal of the OPL 145. It will be recognized that the concept of utilizing an ALD layer to protect exposed dielectric layers during the etching of blok layers may be utilized in other manners. For example, various process steps are not required to be performed in the sequence shown in FIGS. 2-11. Thus, other sequences may be utilized will still gaining the benefit of the techniques described herein. For example, an alternative process flow is shown in FIGS. 12-21. As shown in FIGS. 12-21, a plasma ash process may be used to remove the OPL layer before the ALD layer formation. In this case, the structures and process as shown in FIGS. 12, 13, and 14 are similar to those shown in FIGS. 2, 3, and 4. However, after the upper low k dielectric layer 125 is etched as shown in FIG. 14, the OPL 145 is removed as shown in FIG. 15. The OPL 145 may be removed, for example, by a plasma etch process. The formation of the ALD layers and etching of the blok layers and dielectric layers may then be performed as illustrated in FIGS. 16-20, much in the same manner as shown in FIGS. 5-10. Then as shown in FIG. 21, the ALD layer 505 and the additional ALD layer portions 805 may be removed by a plasma or non-plasma etch process as shown in FIG. 21, yielding a structure similar to that shown in FIG. 11.

In this manner, an alternative sequences for utilizing ALD layers to protect low k dielectrics during the formation of a skip via has been shown. The process of removing the OPL layer before formation of an ALD layer (FIGS. 12-21) may be less desirable (as compared to the process of FIGS. 2-11) depending upon the characteristics of the OPL removal process. Because the ALD layer is not yet formed, the OPL removal process may cause potential bowing in the exposed regions of the upper low k dielectric layer 125 at the process step of FIG. 15. It will be recognized that many other process sequences and/or combinations of different process layers may be utilized to gain the benefit of an ALD protection layer used during the formation of a skip via, all as would be recognized by one skilled in the art. For example, though shown with regard to the use of a skip via having two low k dielectric layers, the skip via may be formed in more than two low k dielectric layers. Further, though illustrated with regard to a skip via formed in a plurality of dielectric layers, it will be recognized that the techniques described herein may be utilized with a via that is formed in a single dielectric layer and single blok layer.

Thus, a process is provided in which straight sidewall profiles may be obtained for high aspect ratio vias formed in low k dielectric layers used, for example, in a skip via formation process flow. Moreover, the skip via may be formed without bowing occurring in the sidewalls of the low k dielectric regions of the via. The formation of ALD layers as a coating or liner for the via provides protection to the low k dielectric regions that may otherwise be exposed during etching of barrier layers such as blok layers. The ALD protection layer thus provides protection to the via sidewall during subsequent process steps, such as blok etch steps, OPL ash steps, or other process steps which may cause undercut and/or bowing in the low k dielectric sidewalls of a via. The techniques described, thus, provide a variety of advantages. First, the sidewall profiles of the via may be relatively straight without the formation of bowing. Second, the use of thin ALD layers may be formed uniformly in a manner that does not dramatically change the via critical dimension. Third, the ALD layers may be easily removed. Fourth, the addition of the ALD layers may be integrated into standard skip via process flows through the addition of only two ALD depositions and one ALD removal step. Finally, it is noted that an ALD silicon dioxide layer provides a protective barrier on the sidewalls but is easily removed from the top surfaces of the barrier layers during the barrier etch steps. Other advantageous may also be recognized by those skilled in the art having the benefit of disclosure provided herein. This is in contrast to forming a polymer in the via, as a polymer layer would provide difficulties at the barrier etch step (potentially blocking the barrier layer etch). Further, polymer formation in a via could potentially block the upper opening of the via, inhibiting all subsequent etching of the via after the polymer formation.

As described herein, ALD layers are provided to protect the low k dielectrics during the formation of skip vias in the low k dielectrics. The deposition of ALD layers and the etching characteristics of the plasma etch(es) used to etch layers underlying the low k dielectrics may be controlled in a manner such that bowing of the low k dielectrics does not occur. Thus, for example, the thickness and material composition of the ALD layers may be controlled to achieve the target processing characteristics described herein, along with control of the etching processes used to etch the barrier layers.

Figure 22:
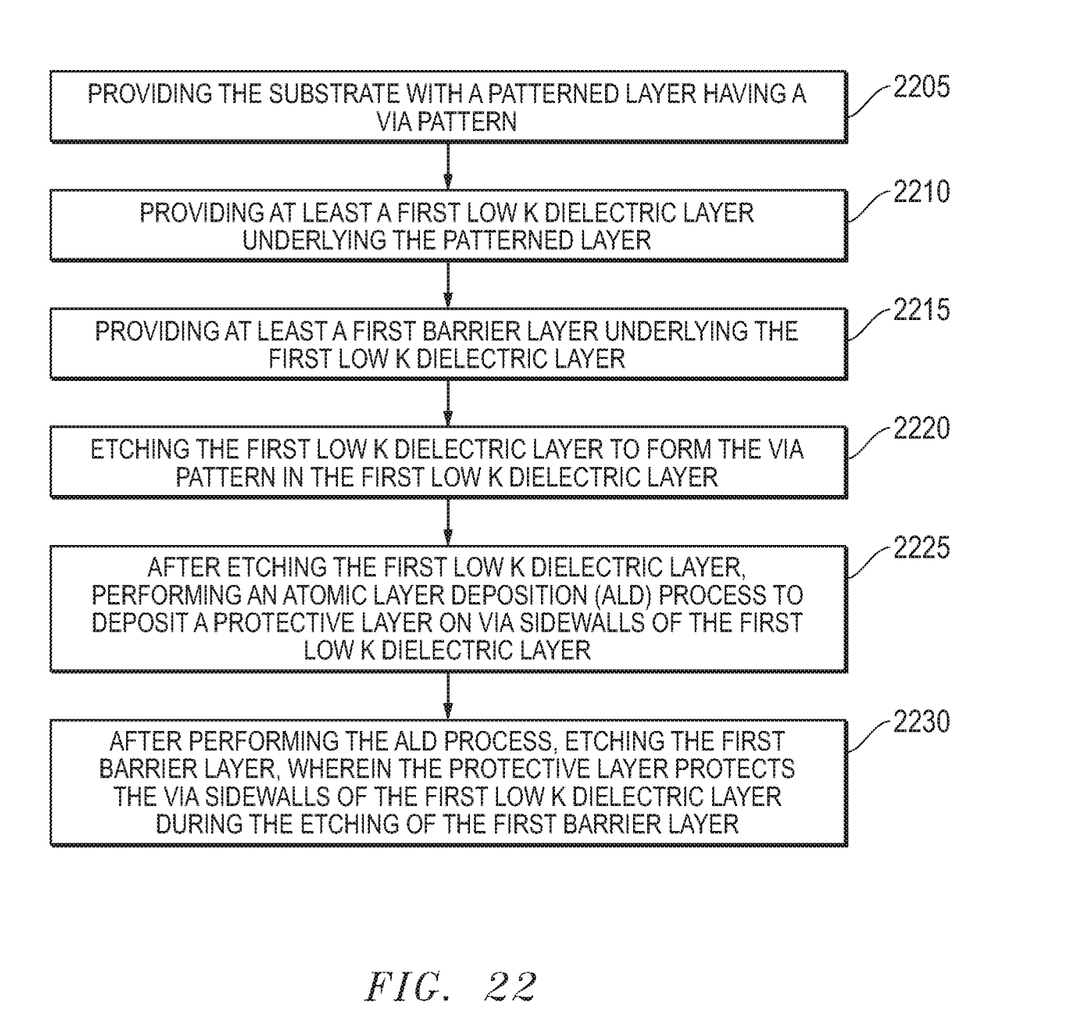
FIGS. 22-24 illustrate exemplary steps for exemplary methods for utilizing the via etching techniques described herein.
Figure 23:
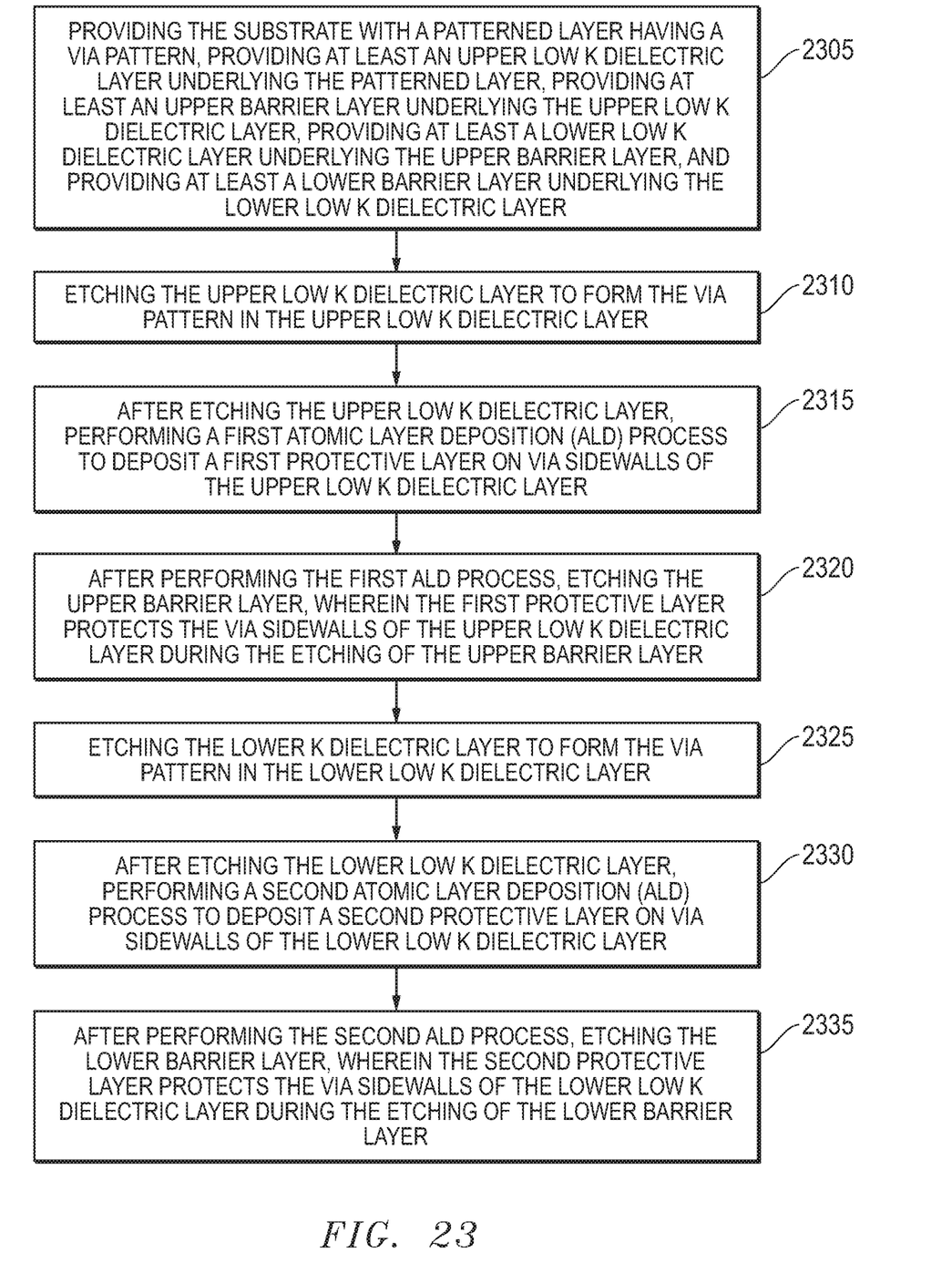
Figure 24:
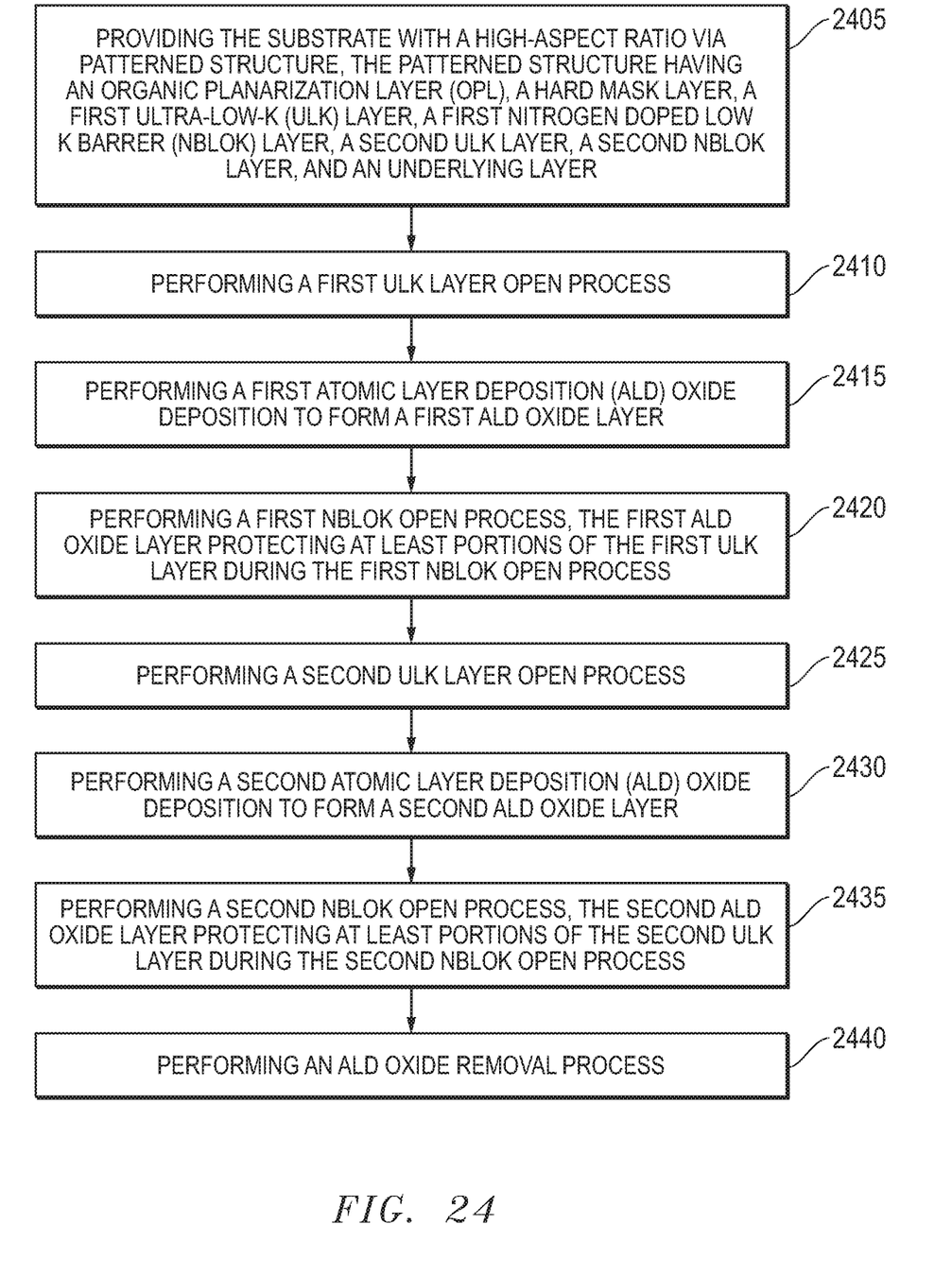

Exemplary process flows for utilizing the techniques described herein are provided in FIGS. 22-24. It will be recognized that these process flows are merely exemplary and the techniques described herein may be utilized in other manners. Further, it will be recognized that additional steps may be added to the exemplary process flows while still utilizing the advantageous benefits of the techniques disclosed herein. Additionally, it will be recognized by those skilled in the art that various steps of the process flows may be performed together or in combination or in a different order and thus, each step of the process flows is not limited to being a separate independent process step as shown.

FIG. 22 illustrates a method for processing a substrate to form a via. The method may include a step 2205 of providing the substrate with a patterned layer having a via pattern. The method also includes a step 2210 of providing at least a first low k dielectric layer underlying the patterned layer. The method further includes a step 2215 of providing at least a first barrier layer underlying the first low k dielectric layer. At step 2220 etching the first low k dielectric layer to form the via pattern in the first low k dielectric layer occurs. After etching the first low k dielectric layer, the method includes performing an atomic layer deposition (ALD) process to deposit a protective layer on via sidewalls of the first low k dielectric layer, as shown at step 2225, the atomic layer deposition process being separate from the etching the first low k dielectric layer step. After performing the ALD process, the method includes etching the first barrier layer, wherein the protective layer protects the via sidewalls of the first low k dielectric layer during the etching of the first barrier layer, as shown at step 2230 to limit bowing of the first low k dielectric layer.

FIG. 23 illustrates a method for processing a substrate to form a skip via. The method may include a step 2305 of providing the substrate with a patterned layer having a via pattern, providing at least an upper low k dielectric layer underlying the patterned layer, providing at least an upper barrier layer underlying the upper low k dielectric layer, providing at least a lower low k dielectric layer underlying the upper barrier layer, and providing at least a lower barrier layer underlying the lower low k dielectric layer. The method further includes the step 2310 of etching the upper low k dielectric layer to form the via pattern in the upper low k dielectric layer. After etching the upper low k dielectric layer, the method includes performing a first atomic layer deposition (ALD) process to deposit a first protective layer on via sidewalls of the upper low k dielectric layer, as shown at step 2315. After performing the first ALD process, the method includes step 2320 of etching the upper barrier layer, wherein the first protective layer protects the via sidewalls of the upper low k dielectric layer during the etching of the upper barrier layer to limit bowing of the upper low k dielectric layer. The method further includes step 2325 of etching the lower low k dielectric layer to form the via pattern in the lower low k dielectric layer. After etching the lower low k dielectric layer, the method includes step 2330 of performing a second atomic layer deposition (ALD) process to deposit a second protective layer on via sidewalls of the lower low k dielectric layer. After performing the second ALD process, the method includes step 2335 of etching the lower barrier layer, wherein the second protective layer protects the via sidewalls of the lower low k dielectric layer during the etching of the lower barrier layer to limit bowing of the lower low k dielectric layer.

FIG. 24 illustrates a method of patterning a substrate. The method may include a step 2405 of providing the substrate with a high-aspect ratio via patterned structure, the patterned structure having an organic planarization layer (OPL), a hard mask layer, a first ultra-low K (ULK) layer, a first nitrogen doped low k barrier (nblok) layer, a second ULK layer, a second nblok layer, and an underlying layer. The method may further include step 2410 of performing a first ULK layer open process. The method further includes step 2415 of performing a first atomic layer deposition (ALD) oxide deposition to form a first ALD oxide layer. The method also includes step 2420 of performing a first nblok open process, the first ALD oxide layer protecting at least portions of the first ULK layer during the first nblok open process. Step 2425 of the method includes performing a second ULK layer open process. The method includes step 2430 of performing a second atomic layer deposition (ALD) oxide deposition to form a second ALD oxide layer. The method then includes step 2435 of performing a second nblok open process, the second ALD oxide layer protecting at least portions of the second ULK layer during the second nblok open process. The method also includes step 2440 of performing an ALD oxide removal process.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method for processing a substrate to form a via, comprising:
    providing the substrate with a patterned layer having a via pattern;
    providing at least a first low k dielectric layer underlying the patterned layer;
    providing at least a first barrier layer underlying the first low k dielectric layer;
    providing an organic planarization layer between the patterned layer and the first low k dielectric layer;
    etching the first low k dielectric layer to form the via pattern in the first low k dielectric layer;
    after etching the first low k dielectric layer, performing an atomic layer deposition process to deposit a protective layer on via sidewalls of the first low k dielectric layer, the atomic layer deposition process being separate from the etching the first low k dielectric layer step;
    after performing the atomic layer deposition process, etching the first barrier layer, wherein the protective layer protects the via sidewalls of the first low k dielectric layer during the etching of the first barrier layer to limit bowing of the first low k dielectric layer; and
    removing the organic planarization layer after etching the first barrier layer.

2. The method of claim 1, wherein the via is a skip via.

3. The method of claim 1, wherein the protective layer comprises a silicon oxide.

4. The method of claim 3, wherein the first low k dielectric layer is a first ultra-low k dielectric layer.

5. The method of claim 4, the first barrier layer is a nitrogen doped low k barrier layer.

6. The method of claim 5, further comprising removing the protective layer after etching the first barrier layer.

7. A method for processing a substrate to form a skip via, comprising:
    providing the substrate with a patterned layer having a via pattern;
    providing at least an upper low k dielectric layer underlying the patterned layer;
    providing at least an upper barrier layer underlying the upper low k dielectric layer;
    providing at least a lower low k dielectric layer underlying the upper barrier layer;
    providing at least a lower barrier layer underlying the lower low k dielectric layer;
    etching the upper low k dielectric layer to form the via pattern in the upper low k dielectric layer;
    after etching the upper low k dielectric layer, performing a first atomic layer deposition (ALD) process to deposit a first protective layer on via sidewalls of the upper low k dielectric layer;
    after performing the first ALD process, etching the upper barrier layer, wherein the first protective layer protects the via sidewalls of the upper low k dielectric layer during the etching of the upper barrier layer to limit bowing of the upper low k dielectric layer;
    etching the lower low k dielectric layer to form the via pattern in the lower low k dielectric layer;
    after etching the lower low k dielectric layer, performing a second atomic layer deposition (ALD) process to deposit a second protective layer on via sidewalls of the lower low k dielectric layer; and
    after performing the second ALD process, etching the lower barrier layer, wherein the second protective layer protects the via sidewalls of the lower low k dielectric layer during the etching of the lower barrier layer to limit bowing of the lower low k dielectric layer.

8. The method of claim 7, further comprising:
    providing an organic planarization layer between the patterned layer and the upper low k dielectric layer; and
    removing the organic planarization layer before performing the first ALD process.

9. The method of claim 7, further comprising:
    providing an organic planarization layer between the patterned layer and the upper low k dielectric layer; and
    removing the organic planarization layer after etching the lower barrier layer.

10. The method of claim 7, wherein the first protective layer and the second protective layer comprise silicon oxide.

11. The method of claim 10, wherein the upper low k dielectric layer is an upper ultra-low k dielectric layer and the lower low k dielectric layer is a lower ultra-low k dielectric layer.

12. The method of claim 11, the upper barrier layer is an upper low k barrier layer and the lower barrier layer is a lower low k barrier layer.

13. The method of claim 12, further comprising removing the first protective layer and the second protective layer after the etching the lower barrier layer.

14. The method of claim 7, further comprising removing the first protective layer and the second protective layer after the etching the lower barrier layer.

15. A method of patterning a substrate, the method comprising:
    providing the substrate with a via patterned structure, the patterned structure having an organic planarization layer (OPL), a hard mask layer, a first ultra-low K (ULK) layer, a first nitrogen doped low k barrier (nblok) layer, a second ULK layer, a second nblok layer, and an underlying layer;
    performing a first ULK layer etching process;
    performing a first atomic layer deposition oxide deposition to form a first atomic layer deposition oxide layer;
    performing a first nblok etching process, the first atomic layer deposition oxide layer protecting at least portions of the first ULK layer during the first nblok etching process;
    performing a second ULK layer etching process;

performing a second atomic layer deposition oxide deposition to form a second atomic layer deposition oxide layer;

performing a second nblok etching process, the second atomic layer deposition oxide layer protecting at least portions of the second ULK layer during the second nblok etching process; and performing an atomic layer deposition oxide removal process.

16. The method of claim 15, further comprising:
removing the OPL before performing the first atomic layer deposition oxide deposition.

17. The method of claim 15, further comprising:
removing the OPL after performing the second nblok etching process.

18. The method of claim 15, wherein the first atomic layer deposition oxide layer prevents bowing of the first ULK layer during the first nblok etching process and the second atomic layer deposition oxide layer prevents bowing of the second ULK layer during the second nblok etching process.

19. The method of claim 18, wherein the method of patterning a substrate is utilized to form a skip via.

* * * * *

UNITED STATES PATENT AND TRADEMARK OFFICE
CERTIFICATE OF CORRECTION

PATENT NO. : 11,121,027 B2  
APPLICATION NO. : 16/213628  
DATED : September 14, 2021  
INVENTOR(S) : Yen-Tien Lu et al.

Page 1 of 1

It is certified that error appears in the above-identified patent and that said Letters Patent is hereby corrected as shown below:

On the Title Page

Column 2, "Other Publications", Line 1, "Nternational Searching Authority," should be --International Searching Authority,--.

In the Specification

Column 1, Lines 39-40, "As critical dimensions of vias shrink and aspect ratios increase, it has become increasing difficult to maintain the" should be --As critical dimensions of vias shrink and aspect ratios increase, it has become increasingly difficult to maintain the--.

Column 6, Lines 41-42, "Thus, other sequences may be utilized will still gaining the benefit of the techniques" should be --Thus, other sequences may be utilized while still gaining the benefit of the techniques--.

Column 6, Line 59, "In this manner, an alternative sequences" should be --In this manner, an alternative sequence--.

Column 7, Line 39, "Other advantageous may also be" should be --Other advantages may also be--.

In the Claims

Column 9, Lines 55-56, Claim 5, "The method of claim 4, the first barrier layer is a nitrogen doped low k barrier layer." should be --The method of claim 4, wherein the first barrier layer is a nitrogen doped low k barrier layer.--.

Column 10, Lines 43-44, Claim 12, "The method of claim 11, the upper barrier layer is an upper low k barrier layer and" should be --The method of claim 11, wherein the upper barrier layer is an upper low k barrier layer and--.

Signed and Sealed this  
Eleventh Day of January, 2022

Drew Hirshfeld  
*Performing the Functions and Duties of the*  
*Under Secretary of Commerce for Intellectual Property and*  
*Director of the United States Patent and Trademark Office*